United States Patent [19]

Tam et al.

[11] Patent Number: 4,593,453

[45] Date of Patent: Jun. 10, 1986

[54] TWO-LEVEL TRANSISTOR STRUCTURES AND METHOD UTILIZING MINIMAL AREA THEREFOR

[75] Inventors: Matthias L. Tam, Monterey Park; Frank Z. Custode, Norco, both of Calif.

[73] Assignee: Rockwell International Corporation, El Segundo, Calif.

[21] Appl. No.: 621,773

[22] Filed: Jun. 18, 1984

Related U.S. Application Data

[62] Division of Ser. No. 383,395, Jun. 1, 1982, abandoned.

[51] Int. Cl.⁴ .................. H01L 29/78; H01L 21/425
[52] U.S. Cl. .................................. 29/571; 29/578; 29/576 B; 29/577 R; 148/1.5; 357/42; 357/59; 357/23.9
[58] Field of Search ............... 29/571, 578, 576 B, 29/577; 148/1.5; 357/42, 55, 59, 23 TF, 23 S, 4

[56] References Cited

U.S. PATENT DOCUMENTS

| | | | |
|---|---|---|---|
| 4,057,824 | 11/1977 | Woods | 357/23.7 X |
| 4,106,045 | 8/1978 | Nishi | 357/23.7 X |
| 4,160,260 | 7/1979 | Weitzel et al. | 357/23.7 |
| 4,466,172 | 8/1984 | Batra | 357/23.9 X |
| 4,517,729 | 5/1985 | Batra | 357/23.9 X |

FOREIGN PATENT DOCUMENTS

| | | | |
|---|---|---|---|
| 0097384 | 8/1978 | Japan | 357/59 |
| 0062771 | 5/1980 | Japan | 357/42 |
| 0142578 | 8/1983 | Japan | 357/42 |

OTHER PUBLICATIONS

Translation of Wada JA54-97384.
Translation of Iizuka JA55-62771.

*Primary Examiner*—Brian E. Hearn
*Assistant Examiner*—David A. Hey
*Attorney, Agent, or Firm*—H. Fredrick Hamann; Wilfred G. Caldwell

[57] ABSTRACT

The invention relates to the process for manufacturing and the structure of stacked transistors on a silicon substrate wherein a polysilicon layer is employed which is recrystallized and delineated to form the gate for one transistor and the source, channel and drain for the complementary transistor which is totally formed using isolating field oxide as its substrate.

2 Claims, 13 Drawing Figures

TWO-LEVEL TRANSISTOR STRUCTURES AND METHOD UTILIZING MINIMAL AREA THEREFOR

This application is a division of application Ser. No. 383,395, filed June 1, 1982 now abandoned.

FIELD OF THE INVENTION

The invention relates to a novel structure and method for forming stacked transistors and, in particular, CMOS structures for latch-up free operations.

BACKGROUND OF THE INVENTION

In Volume EDL-2, No. 10, October 1981 of IEEE Electron Device Letters at page 250, J. P. Colinge and E. Demoulin presented a paper entitled "A High Density CMOS Inverter with Stacked Transistors". This paper describes a complete CMOS inverter, whose P-channel transistors made from laser annealed polycrystalline silicon and is superimposed upon the N-channel transistor made in a bulk silicon substrate. The single gate is common to both transistors. The process is NMOS compatible and polysilicon transistors with channel lengths down to four micrometers have been made. However, the prior art does not teach metal gate PMOS, polygate NMOS wherein both are self-aligning. Neither does the prior art teach a two-layer device with one type device built on bulk silicon and a single type built on a recrystallized polysilicon layer where only a single polylayer is employed. The same is true for CMOS devices and enhancement-depletion devices utilizing either NMOS or PMOS technology. Since isolation wells are not used to isolate the NMOS from PMOS, all common PNPN paths are eliminated so that the CMOS bulk devices are latch-up free—all with an increased density advantage over existing techniques because of the elimination of space taken up by isolation wells.

BRIEF DESCRIPTION OF THE INVENTION

The invention is a two-layer multi-transistor device minimizing chip area required per transistor. One device is built on bulk silicon and the second device is built on the field oxide from a laser recrystallized polysilicon layer of which only one is required in the multi-transistor structure, thereby simplifying the process. Initially, the active area of the bulk silicon device is surrounded by field oxide and covered by a thin layer of gate oxide. Undoped polysilicon is deposited over the field oxide and recrystallized by laser beam or other appropriate technique. A second mask provides for defining a gate for the bulk silicon device and an active area on the field oxide for the second level device. The poly is lightly doped everywhere with the appropriate species (N−) and a third mask is used to define, e.g., the NMOS areas. Next, the drain source, and gate may be implanted N+, followed by cross-over oxide (N+). Then mask 4 is used to etch the cross-over oxide to define the P-channel active area. Nitride is deposited and mask 5 defines the P-channel gate. P+ is used to dope the drain and source of the PMOS device followed by oxidation over the P+ drain and source area. The nitride is removed to bare poly to rent the growing of the P-channel gate oxide. Contact mask 6 is used to etch the oxide followed by metal deposition and mask 7 serves to etch the metal followed sintering. The principles permit the production of matched transistors, enhancement-depletion devices, either NMOS or PMOS, and other conventional FET structures.

BRIEF DESCRIPTION OF THE DRAWINGS

FIG. 7A shows masks 3, 4, and 5;

DESCRIPTION OF A PREFERRED EMBODIMENT

Figure 1:
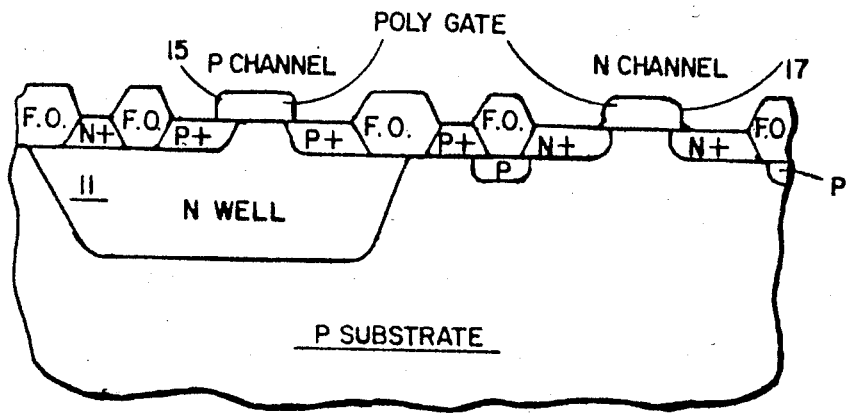
FIG. 1 is a view of a common known well-type prior art device.

In the prior art showing of FIG. 1 a typical N-well 11 is employed beneath the P-channel device. However, this prior art does show the use of single poly for both PMOS and NMOS. Both the PMOS and NMOS are N+ poly gates. Some extreme disadvantages of this structure are the fact that the scalability is limited by the diffusions to the well spacings, i.e., density restrictions, latch-up will occur due to the existence of PNPN paths, and high body constant for devices in the well because of the high concentration (doping) are experienced. This well approach NMOS/CMOS by Ken Yu, et al., appears in ISSCC 81, paper FAM 15.1.

Figure 2:
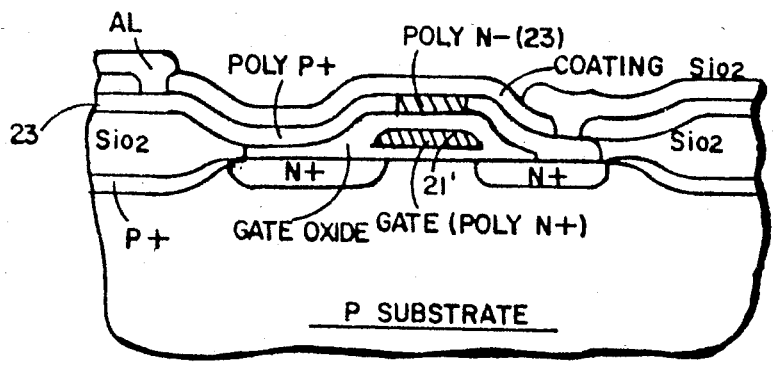
FIG. 2 is a prior art well-less type stacked arrangement of transistors.

Considering the second approach taken by the prior art as illustrated in FIG. 2, this Stacked Transistor approach has been documented in the Background of the Invention section. However, this prior art involves two layers of polysilicon, i.e., the gate poly 21 and the poly layer 23. Poly 21 comprises the gate for the first transistor and poly level 23 comprises the second transistor stacked thereabove. Since the NMOS and PMOS have poly gates the PMOS device is not self-aligned, i.e., it will require device size to density and speed compromises, however, there is no latch-up because of the elimination of the PNPN paths. Laser recrystallization of the second poly is required.

Figure 3:
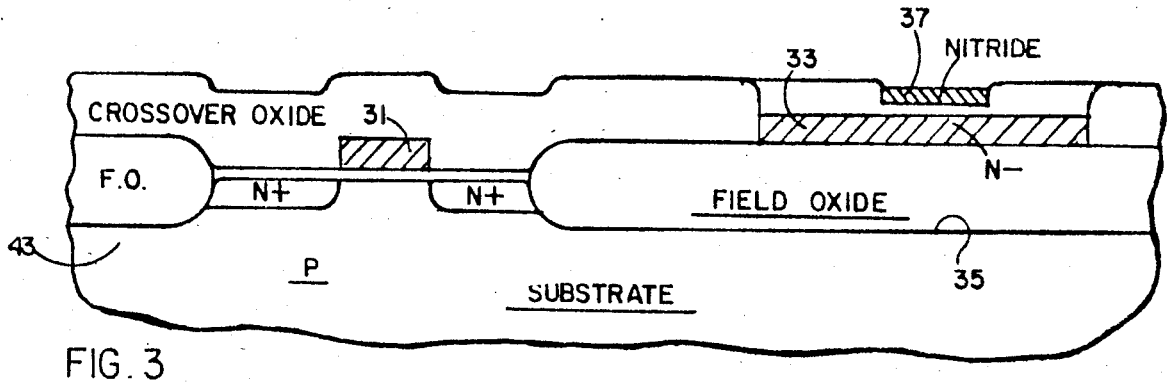
FIG. 3 shows a device of the present invention during processing.

FIGS. 3 through 12 show a preferred present device and process for manufacturing the same. FIG. 3 shows a CMOS device in process of manufacture wherein a single layer of polysilicon has been employed to form the NMOS gate 31 and the body portion 33 of the PMOS device deposited on the field oxide 35 nitride 37 being used to maintain or preserve the N-channel between the source and drain 39 and 41 (FIG. 3A) formed between the steps of FIGS. 3 and 3A. Thus, in FIG. 3A it may be seen that the NMOS device is formed to the left on the bulk silicon substrate 43 employing the portion 31 of the single poly layer as the gate for this device which is isolated in the cross-over oxide 45.

Figure 3A:
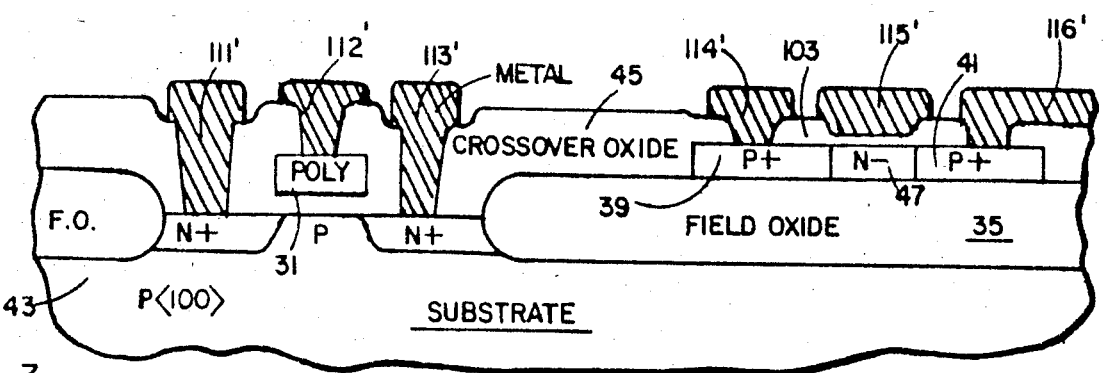
FIG. 3A shows a preferred manufactured product.

On the right-hand side of FIG. 3A, it will be apparent that the PMOS device utilizes another portion of the single poly layer as the source 39, drain 41, and channel 47, all situated on top of the field oxide 35.

In comparing the preferred device of the present invention with the prior art set forth herein, it will be seen that, for a stacked device, the present invention offers the only single poly layer process, which of course simplified the process and renders greater yields. The obvious advantage of density improvement over the ubiquitous well approach provides scalability to submicron dimensions. Also, both PMOS and NMOS are self-aligning and can be separately optimized. This improves speed and performance in general. By utilizing the silicon field oxide for the PMOS device there can be no latch-up because there is no PNPN path.

It will be realized, of course, that the devices can be reversed in position and manufactured similarly where other devices may be built in the processing according to the principles herein taught, i.e., either N-channel or P-channel can be built on the bulk silicon and two-layer enhancement depletion devices with either FET built on the bulk silicon may be accommodated.

Figure 4:
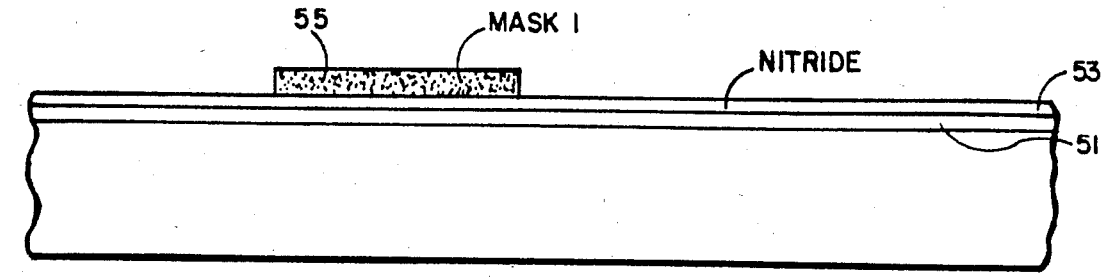
FIG. 4 shows the first step in the preferred process of the present invention.
Figure 5:
FIG. 5 shows the gate oxide covering the active region of the left-hand bulk silicon transistor device being formed surrounded by field oxide.
Figure 6:
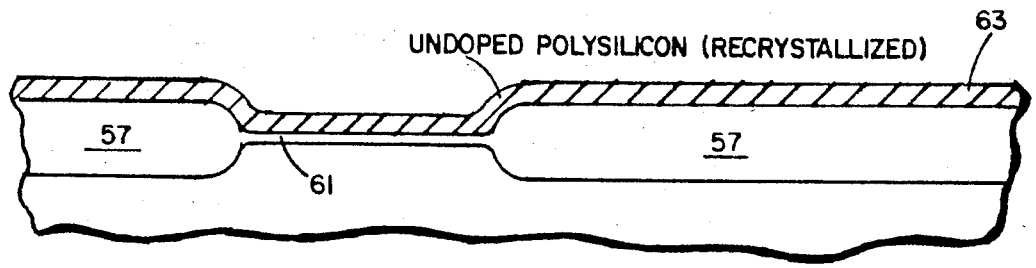
FIG. 6 shows the structure of FIG. 5 covered by undoped, recrystallized polysilicon.

The preferred process is set forth in FIGS. 3 through 12 wherein the silicon wafer comprises the bulk silicon 43 which is oxidized to form a first oxide layer 51 covered by a nitride layer 53 and mask 1 of FIG. 6 is used to define the active area of the left-hand transistor device, shown herein as an NMOS device. The resist 55 protects the underlying deposited nitride layer 53 and silicon oxide layer 51 during removal of the uncovered nitride and oxide layers.

Next, field oxide 57 is conventionally grown in the regions not covered by the resist 55. Followed by the removal of the resist 55 an underlying nitride layer 53 and oxide layer 51 to expose the bare surface of silicon in the active region.

The next step is to grow gate oxide in the active region as is illustrated at 61 in FIG. 5.

In summary, the process involving FIGS. 4 and 5, in it preferred from utilizes the following steps:

Step 1—Grow oxide and deposit nitride;

Step 2—Use mask 1 for active area of NMOS device being formed;

Step 3—Remove oxide and nitride with the mask resist protecting the underlying portion of the oxide and nitride;

Step 4—Grow field oxide and then remove the resist and nitride and oxide layers covered thereby followed by growing a gate oxide in the active region;

In FIG. 6, the structure of FIG. 5 has been covered by undoped polysilicon shown as the layer 63 which is subsequently recrystallized. Thus, the listing of the preferred process may be updated as follows:

Step 5—Deposit undoped polysilicon followed by recrystallization.

Figure 7:
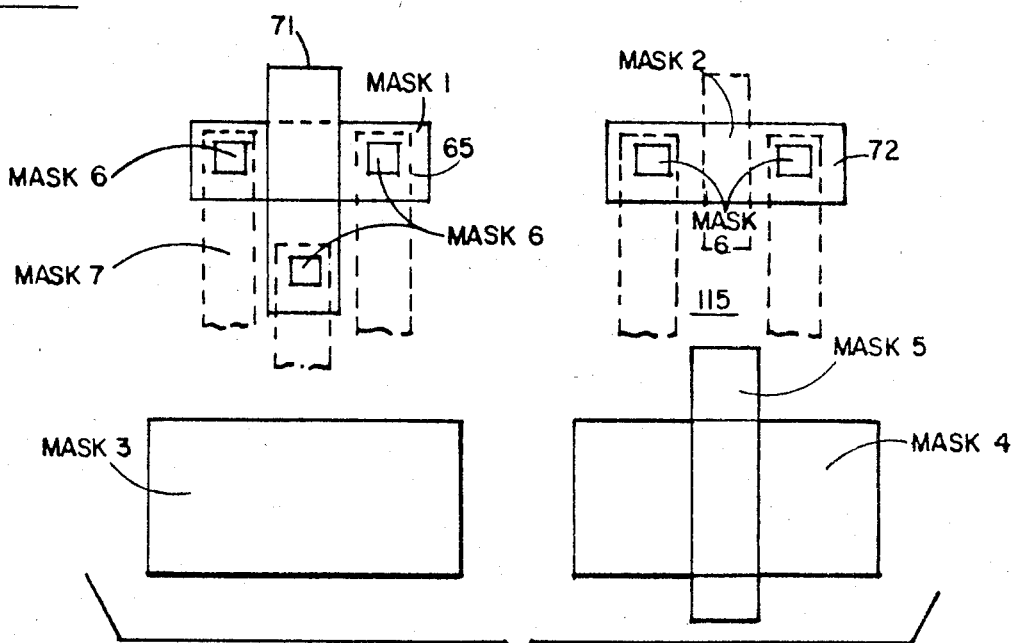
FIG. 7 shows masks 1, 2, 6, and 7.

In FIGS. 7 and 7A, all masks are shown which are necessary to the process for building the CMOS chip. Mask 1 is shown at 65 as comprising the rectangular opaque outline which reserved the resist portion 55 after exposure of the resist layer to light and development thereof. Reference will be made further to these two figures as the individual masks are employed in the processing to be described hereinafter.

Figure 8:
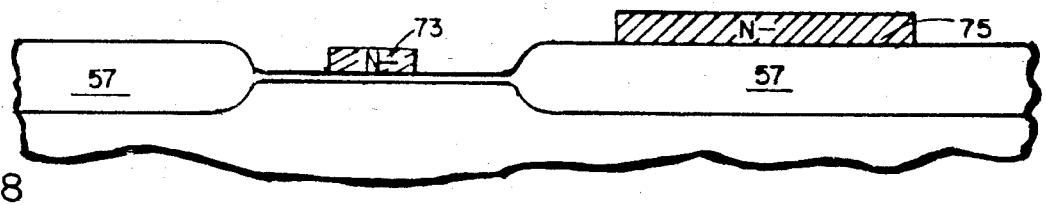
FIG. 8 shows the structure in a succeeding step in the process forming the gate for the left-hand region and the active area on the field oxide for the right-hand transistor region.

In FIG. 8, the polysilicon layer 63 of FIG. 6 has been doped N— everywhere and mask 2 of FIG. 7 consisting of the left-hand vertical rectangular opaque region 71 and the right-hand horizontal opaque region 72 has been utilized with conventional masking and etching techniques to outline the N gate 73 of the left-hand NMOS device being formed and the active area 75 for the right-hand PMOS device being formed on the field oxide 57.

Figure 9:
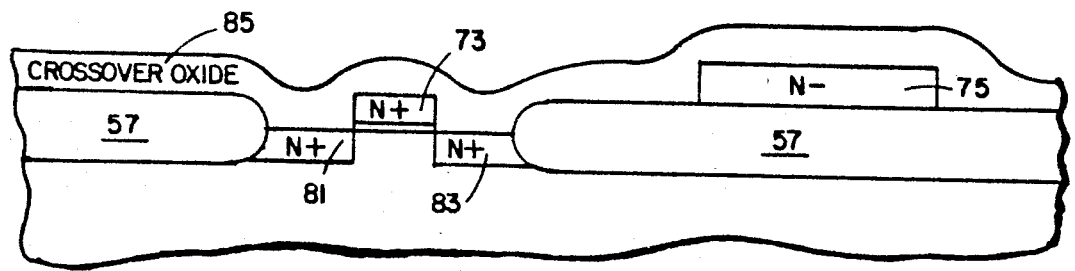
FIG. 9 shows doping of the source and drain for the left-hand transistor and doping for the right-hand transistor being developed on the field oxide.

Hence, the steps 5 through 8 of FIGS. 6 and 7 has:

Step 5, deposit undoped polysilicon followed by recrystalliation;

Step 6, dope the polysilicon N— everywere;

Step 7, use mask 2 for laying down a resist and etching regions of the poly not covered by the resist which are;

Step 8, the N gate region for the NMOS device on the left and the active area on the field oxide for the device for the PMOS device on the right;

In FIG. 9, the use of mask 3 of FIG. 7a is incorporated to define the NMOS region of the left-hand device for the purpose of doping the source 81 and drain 83 N+. Mask 3 is in reality an opening rather than being opaque, and accordingly the deposition or implanting of the N+ doping is ineffective in the field oxide 57 and merely changes the doping of the gate poly 73 from N— to N+. However, it is effective on the bare silicon to dope the source 81 and drain 83. Next, the cross-over oxide or Silox 85 is deposited over the entire region. Accordingly, the steps of the process now added are:

Step 9—Use mask 3 to define the NMOS area.

Step 10—Ion implant N+ in drain/source of the NMOS areas.

Step 11—Deposit cross-over oxide.

Figure 10:
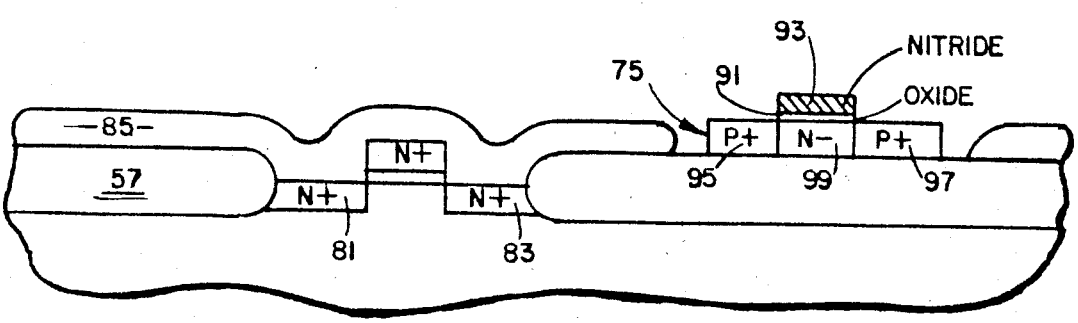
FIG. 10 depicts doping of the PMOS drain and source.
Figure 11:
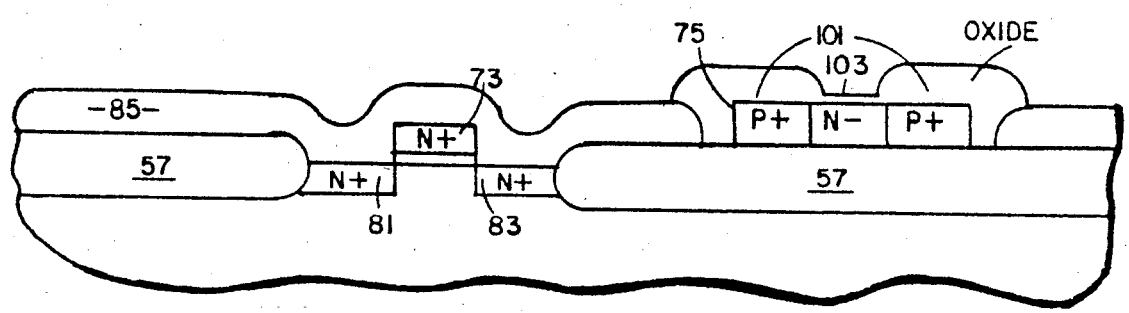
FIG. 11 shows the growing of the P+ gate oxide.

In FIG. 10, mask 4 of FIG. 7A is utilized to etch the cross-over oxide 57 from the PMOS active area 75. Mask 4 is an open mask for the entire active area 75. Once the region 75 is bared to the poly, the oxide 91 is grown and a layer of nitride 93 is deposited thereover. In the next step, mask 5 of FIG. 7A is employed, being an opaque mask to define the PMOS gate region and to provide hardened resist thereover such that the nitride layer 93 and oxide layer 91 which are uncovered are removed. The PMOS source 95 and drain 97 are then doped P+ by ion implantation whereas the channel region 99 is protected by the nitride 93. Finally, in FIG. 10, the nitride 93 and the oxide 91 are removed to permit the subsequent step of oxidation over the PMOS drain-source region as shown in FIG. 11 at 101. Thus, the steps now enumerated are as follows:

Step 12, use open mask 4 for etching the cross-over oxide from the P active area.

Step 13, grow oxide over region 75 and deposit nitride thereover,

Step 14, use mask 5 to define the PMOS gate and remove the oxide and nitride layers except under mask 5.

In FIG. 11, the next step is illustrated by oxidation of the exposed field oxide 57 and the poly region 75 with the oxidation shown at 101. Next, the nitride 93 and the oxide 91 are removed, followed thereafter by growing the thin field oxide 103 over the gate region of the N— poly body 75. Thus, the following steps have been achieved;

Step 15, dope the drain and source 95 and 97 P+ (FIG. 10).

Step 16, oxidize over the P+ drain and source areas.

Step 17, remove the nitride and oxide to bare poly and grow the thin gate oxide for the PMOS device.

Figure 12:
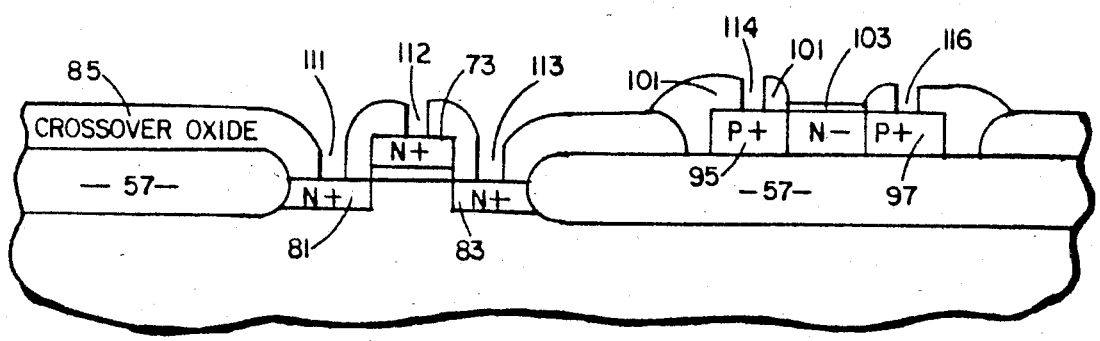
FIG. 12 illustrates the opening of contact regions.

In FIG. 12, the chip being processed has been prepared for metal deposition by employing contact mask 6 of FIG. 7 to open the source 81 by opening 111, gate 73 by opening 112, and drain 83 by opening 113 through the cross-over oxide 85 for the NMOS device. For the PMOS device it is only necessary to provide openings 114 and 116 to the source 95 and drain 97 because the gate 103 is already open to receive the metal deposits, which results in a metal-gate PMOS device.

The metallization mask 7 is also pictured in FIG. 7 and shows the outline of the metal conductive film preserved to connect in FIG. 3 to the metal contacts 111', 112', 113', 114' and 116'. The gate contact 115' is automatically provided by the metal at the location 115 of FIG. 7.

It may be appreciated now that even simpler devices may be manufactured by the principles herein set forth (i.e.) two NMOS devices may be produced utilizing the process outlined for the left-hand NMOS device or similarly two PMOS devices may be produced utilizing the process outlined for the right-hand PMOS device. The concept of stacking simply permits greater density of whichever devices are selected for processing and this includes self-aligned devices due to the use of mask 2. Hundreds of thousands of devices may be manufactured on a single chip whether they be CMOS devices, depletion and/or enhancement FETS or unitary assemblies.

In summary, it will be appreciated that the gate of the first transistor is self-aligned to its drain and source by use of the poly mask 2. It should further be appreciated that the gate of the second transistor is self-aligned to its own drain and source by virtue of mask 5. The single layer of polysilicon provides the first transistor gate 73 and the active body portion 75 for the second transistor. Use of the mask 2 defines the active body portion of the second transistor while defining the gate of the first transistor. Also, mask 5 defines the drain, source and gate of the second transistor by virtue of the active polysilicon portion 75. Consequently, inherent alignment is manifested between the two transistors. It should further be noted that all elements of each transistor are in linear alignment, thus, again improving the yield and conserving the space otherwise required.

What is claimed is:

1. A method for manufacturing complementary self-aligned NMOS and PMOS stacked transistors using a P doped silicon substrate, comprising the steps of:

selectively growing field oxide around an active area on a first surface of the substrate;

growing a gate oxide over the active area;

depositing a layer of undoped polysilicon over the first surface, followed by recrystallization of the polysilicon;

doping the polysilicon N−;

delineating an N gate region for the NMOS transistor being formed from the polysilicon layer and an active area from the polysilicon layer on the field oxide for the PMOS transistor being formed;

outlining the NMOS active area for the NMOS transistor being formed;

ion implanting N+ dopant in the outlined NMOS area including the drain and source, and enhancing the N− polysilicon of the gate region to N+;

depositing cross-over oxide over the field oxide, NMOS transistor being formed, and the PMOS polysilicon active area;

removing the cross-over oxide from the PMOS active area;

growing oxide over the PMOS active area and depositing nitride thereover;

delineating at least a PMOS gate on the polysilicon active area, the removing the oxide and nitride layers except over the PMOS gate;

doping the PMOS drain and source P+ while the gate for the PMOS transistor being formed is shielded by the nitride and oxide layer;

oxidizing the field oxide, source and drain of the PMOS active area where the crossover oxide was removed;

removing the gate nitride and oxide layers to bare polysilicon over the PMOS active area, and growing gate oxide for the PMOS transistor;

opening the source, gate, and drain for the NMOS transistor being formed and the source and drain for the PMOS transistor being formed for contacts; and, establishing metal contacts for said source, gate, and drain for the NMOS transistor and said source and drain for the PMOS transistor, and establishing a metal electrode for said PMOS gate.

2. A method for manufacturing complementary self-aligned NMOS and PMOS stacked transistors using a P doped silicon substrate, comprising the steps of:

growing an oxide layer on a first surface of said substrate and depositing a nitride layer on the oxide layer;

using a first mask to delineate an active area for the NMOS transistor being formed;

retaining the oxide layer and nitride layer over the active area while removing the rest of the nitride and oxide layers;

growing field oxide around the active area and then removing the nitride and oxide layers from the active area and growing a gate oxide over the active area;

depositing a layer of undoped polysilicon over the field oxide and the gate oxide, followed by recrystallization of the polysilicon;

doping the polysilicon N−;

using a second mask for delineating an N gate region for the NMOS transistor being formed from the polysilicon layer and an active area from the polysilicon layer on the field oxide for the PMOS transistor being formed;

using a third mask to outline the NMOS active area for the NMOS transistor being formed;

ion implanting N+ dopant in the outlined NMOS area including the drain and source, and enhancing the N− polysilicon of the gate region to N+;

depositing cross-over oxide over the field oxide, NMOS transistor being formed, and the PMOS polysilicon active area;

removing the cross-over oxide from the PMOS active area under control of a fourth mask;

growing oxide over the PMOS active area and depositing nitride thereover;

using a fifth mask to define at least a PMOS gate on the polysilicon active areas, and removing the oxide and nitride layers except under this mask;

doping the PMOS drain and source P+ while the gate for the PMOS is shielded by the nitride and oxide layer;

oxidizing the field oxide, source and drain of the PMOS active area where the crossover oxide was removed;

removing the gate nitride and oxide layers to bare polysilicon over the PMOS active area, and growing gate oxide for the PMOS transistor;

using a sixth mask to open the source, gate, and drain for the NMOS transistor being formed and the source and drain for the PMOS transistor being formed for contacts; and, establishing metal contacts for said source, gate, and drain for the NMOS transistor and said source and drain for the PMOS transistor, and establishing a metal electrode for said PMOS gate.

* * * * *